US008249862B1

(12) United States Patent
Cheng et al.

(10) Patent No.: US 8,249,862 B1

(45) Date of Patent: Aug. 21, 2012

(54) AUDIO PROCESSING APPARATUSES

(75) Inventors: Yiou-Wen Cheng, Taipei County (TW); Hsi-Wen Nien, Hsinchu County (TW)

(73) Assignee: Mediatek Inc., Hsin-Chu (TW)

( * ) Notice: Subject to any disclaimer, the term of this patent is extended or adjusted under 35 U.S.C. 154(b) by 739 days.

(21) Appl. No.: 12/424,048

(22) Filed: Apr. 15, 2009

(51) Int. Cl.

| | |
|---|---|
| ***G10L 19/14*** | (2006.01) |
| ***G10L 21/02*** | (2006.01) |
| ***H04B 15/00*** | (2006.01) |
| ***H03G 5/00*** | (2006.01) |

(52) U.S. Cl. .......... 704/205; 704/226; 381/94.2; 381/98

(58) Field of Classification Search ........................ None
See application file for complete search history.

(56) References Cited

U.S. PATENT DOCUMENTS

| | | | | |
|---|---|---|---|---|
| 5,353,376 | A | 10/1994 | Oh et al. | |
| 6,449,586 | B1 * | 9/2002 | Hoshuyama | 702/190 |
| 7,035,415 | B2 | 4/2006 | Belt et al. | |
| 7,171,008 | B2 * | 1/2007 | Elko | 381/92 |
| 7,203,323 | B2 | 4/2007 | Tashev | |
| 7,305,099 | B2 | 12/2007 | Gustavsson | |
| 7,346,179 | B1 | 3/2008 | Bobisuthi et al. | |
| 7,657,038 | B2 * | 2/2010 | Doclo et al. | 381/94.1 |
| 7,747,001 | B2 * | 6/2010 | Kellermann et al. | 379/406.01 |
| 7,885,417 | B2 * | 2/2011 | Christoph | 381/71.11 |
| 7,957,542 | B2 * | 6/2011 | Sarrukh et al. | 381/92 |
| 2007/0076898 | A1 * | 4/2007 | Sarroukh et al. | 381/92 |
| 2009/0034752 | A1 * | 2/2009 | Zhang et al. | 381/92 |
| 2009/0175466 | A1 * | 7/2009 | Elko et al. | 381/94.2 |

OTHER PUBLICATIONS

W. Herbordt and W. Kellermann, "GSAEC—Embedding Acoustic Echo Cancellation into the Generalized Sidelobe Canceller", Proc. EURASIP European Signal Processing Conference, vol. 3, pp. 1843-1846, Tampere, Finland, Sep. 2000.*

W. Herbordt, W. Kellermann, and S. Nakamura, "Joint Optimization of Acoustic Echo Cancellation and Adaptive Beamforming", Topics in Acoustic Echo and Noise Control, Selected Methods for the Cancellation of Acoustical Echoes, the Reduction of Background Noise, and Speech Processing, Signals and Communication Technology, Part II, pp. 19-50, 2006.*

Radu Ciprian Bilcu, Pauli Kuosmanen, Corneliu Rusu, "Improving Performances of Complementary Pair LMS Algorithm", in Proceedings of X European Signal Processing Conference, EUSIPCO2000, Tampere, Finland, Sep. 3-5, 2000.*

Wang GuangHui; Luo XiaoWu; Zhang-Min, "A new variable step CP-LMS algorithm for beamforming," Microwave and Millimeter Wave Technology, 2004. ICMMT 4th International Conference on, Proceedings , vol., no., pp. 189-191, Aug. 18-21, 2004.*

(Continued)

*Primary Examiner* — Brian Albertalli

(74) *Attorney, Agent, or Firm* — Thomas|Kayden

(57) ABSTRACT

An audio processing apparatus is provided. A beamformer receives input signals and processes the input signals to generate a first processed signal. The input signals include at least one of a source signal and interference. A blocking matrix receives the input signals and operates to cancel the source signal from the input signals to generate a second processed signal. A first adaptive filter has adaptable first filter coefficients, generates a first filtered signal approximating the interference according to the first and second processed signals and continuously adapts the first filter coefficients according to the first filtered signal and the first processed signal. A second adaptive filter has adaptable second filter coefficients, generates a second filtered signal approximating the interference according to the first and second processed signals and selectively adapts the second filter coefficients according to the first filter coefficients and an output signal.

19 Claims, 7 Drawing Sheets

OTHER PUBLICATIONS

L.J. Griffiths and C.W. Jim, "An Alternative Approach to Linearly Constrained Adaptive Beamforming", IEEE Transactions on Antennas and Propagatoin, vol. AP-30, No. 1, pp. 27-34, Jan. 1982.*

Bilcu, R.C.; Kuosmanen, P.; Rusu, C., "A noise constrained VS-LMS algorithm," EUROCOMM 2000. Information Systems for Enhanced Public Safety and Security. IEEE/AFCEA , vol., no., pp. 29-33, 2000.*

Woo-Jin Song; Min-Soo Park, "A complementary pair LMS algorithm for adaptive filtering," Acoustics, Speech, and Signal Processing, 1997. ICASSP-97., 1997 IEEE International Conference on , vol. 3, no., pp. 2261-2264 vol. 3, Apr. 21-24, 1997.*

* cited by examiner

AUDIO PROCESSING APPARATUSES

BACKGROUND OF THE INVENTION

1. Field of the Invention

The invention relates generally to the field of audio processing, and more particularly, to an audio processing apparatus in a communication system with a microphone array.

2. Description of the Related Art

In a communication system, there are three components that are picked up by a microphone, they include: a source signal, interference and echo. The source signal is a desired signal, such as a voice of a speaker. Additionally, only the source signal is required to be sent to a far end side. Thus, echo and interference are considered to be the most objectionable artifacts occurring in communication systems. The echo can be a result of a mismatch at the hybrid network, such as in the network echo case, or the reflections caused by a reverberant environment, such as an acoustic echo. An echo can manifest from the originator in a speech signal, wherein the originator is able to hear his/her own speech after a certain delay. With either kinds of echo, an annoyance factor increases as the amount of the delay increases.

Meanwhile, interference, such as environment noise, also disrupts the proper operation of various subsystems of a communications system, such as the codec. Different kinds of environment noise can vary widely in their characteristics, and a practical noise reduction scheme has to be capable of handling noises with different characteristics.

In order to properly remove the interference and echo picked up by the microphone (or microphone array), an adaptive beamforming filter and adaptive echo cancellation filter are respectively adopted in communications systems. However, as the echo and interference increases, filtering performance thereof degrades. Thus, a novel audio processing method and apparatus in a communication system with a microphone array are proposed.

BRIEF SUMMARY OF THE INVENTION

Audio processing apparatuses are provided. An embodiment of an audio processing apparatus comprises a beamformer, a blocking matrix, a first adaptive filter and a second adaptive filter. The beamformer receives input signals and processes the input signals to generate a first processed signal. The input signals include at least one of a source signal and interference. The blocking matrix receives the input signals and operates to cancel the source signal from the input signals to generate a second processed signal. The first adaptive filter has adaptable first filter coefficients, generates a first filtered signal approximating the interference according to the first and second processed signals and continuously adapts the first filter coefficients according to the first filtered signal and the first processed signal. The second adaptive filter has adaptable second filter coefficients, generates a second filtered signal approximating the interference according to the first and second processed signals and selectively adapts the second filter coefficients according to the first filter coefficients and an output signal.

Another embodiment of an audio processing apparatus comprises an adaptive beamforming filter and an adaptive echo canceller. The adaptive beamforming filter receives a plurality of input signals, comprising at least one of a source signal, interference and echo, in a first acoustic path from a microphone array of the system and operates to cancel the interference from the input signals to generate a first processed signal and selectively change an adaptation step size of a plurality of filter coefficients according to a control signal. The adaptive echo canceller is coupled between the first acoustic path and at least one loudspeaker in a second acoustic path of the system and operates to cancel the echo from the first processed signal to generate a second processed signal, wherein the control signal is generated according to the presence of the echo in the input signals.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
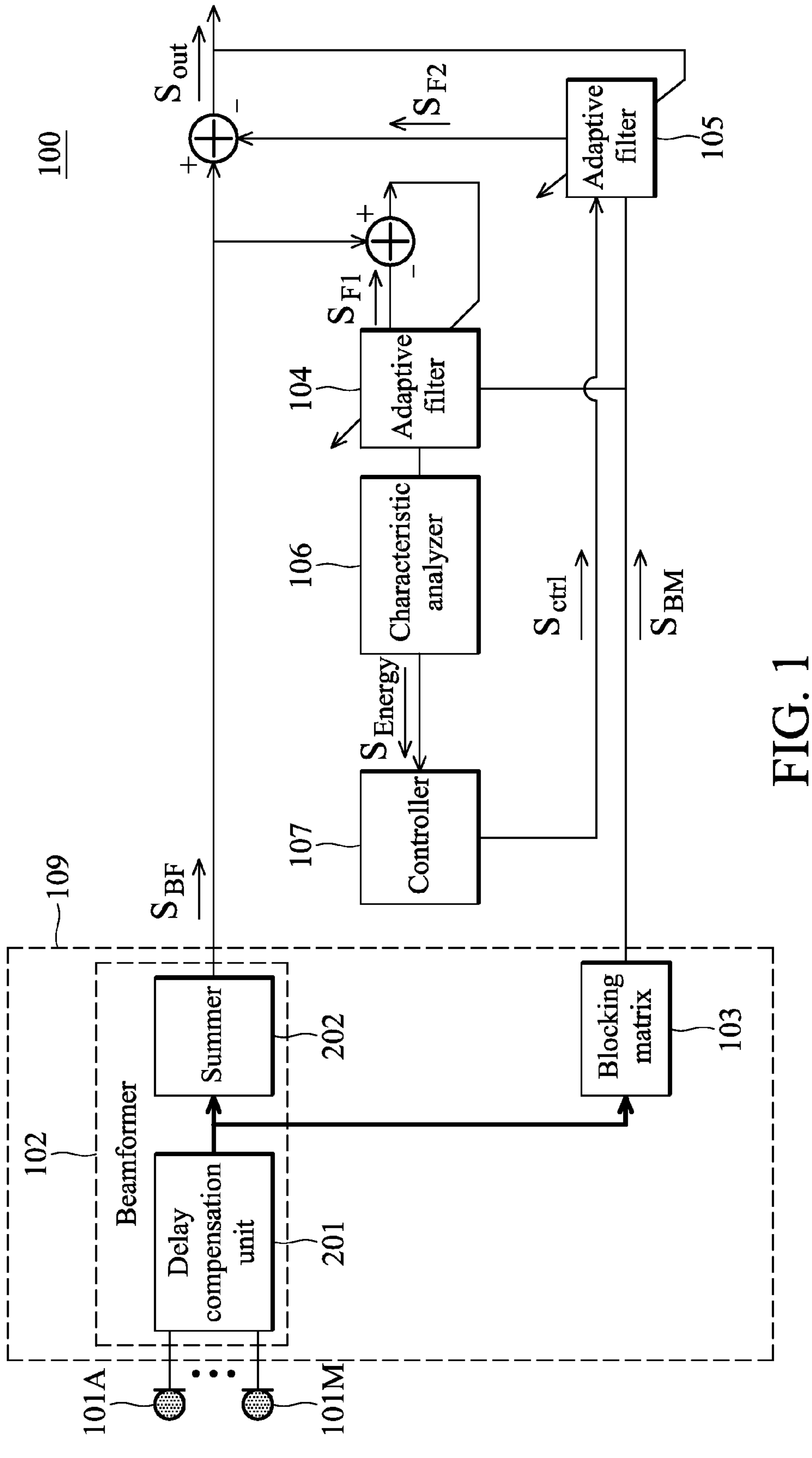
FIG. 1 illustrates an audio processing apparatus in a system according to a first embodiment of the invention.

FIG. 1 illustrates an audio processing apparatus 100 in a system according to a first embodiment of the invention. According to the embodiment of the invention, the system may be a mobile phone or a Bluetooth handset, and use a linear array of sensors, preferably microphones, such as 101A~101M shown in FIG. 1, mounted inside (or disposed outside) of the audio processing apparatus 100 to pick up audio signals. Generally, the audio signal picked up from noisy channels comprises at least one of a source signal and interference, where the source signal is the desired signal, such as voice of a human and the interference refers to all the environment or background noise. Thus, according to an embodiment of the invention, the audio processing apparatus 100 is implemented as an adaptive beamforming filter (ABF) to filter out the interference portion, and output the desired source signal portion.

As shown in FIG. 1, a beamformer 102 receives a plurality of input signals picked up by the microphone array, and processes the input signals to generate a processed signal $S_{BF}$. According to an embodiment of the invention, the beamformer 102 could be implemented as a delay-and-sum beamformer with a delay compensation unit 201 and a summer 202. The delay compensation unit 201 compensates delays of the input signals picked up by different microphones so as to synchronize the input signals. The summer 202 sums the compensated signals to obtain the processed signal $S_{BF}$. Because the processed signal $S_{BF}$ is generated by coherently adding the source signals in each channel and incoherently adding the interference signals, it has a higher signal-to-noise ratio (SNR) than the output from any of the individual microphones. Thus, a microphone array is preferred to be employed.

A blocking matrix 103 is disposed in another audio processing path to receive the input signals and operates to cancel the source signal from the input signals so as to generate another processed signal $S_{BM}$. According to an embodiment of the invention, the blocking matrix 103 receives the delay compensated input signals from the delay compensation unit 201 and may cancel the source signal by subtraction. According to another embodiment of the invention, the beamformer 102 and the blocking matrix 103 may also be integrated as a signal generator 109 for outputting the processed signals $S_{BF}$ and $S_{BM}$. Because the input signals are synchronized after delay compensation, the processed signal $S_{BM}$ containing essentially only interference is obtained by subtracting one channel from another. An exemplary blocking matrix $W_C$ is shown as:

$$W_c = \begin{bmatrix} 1 & & & & 0 \\ -1 & 1 & & & \\ & -1 & 1 & & \\ & & \ddots & \ddots & \\ 0 & & & -1 & 1 \end{bmatrix}, \quad \text{Eq. 1}$$

where the dimension M' of $W_C$ can be determined as M'=M−1 and M represents the number of microphones in the microphone array.

Figure 2:
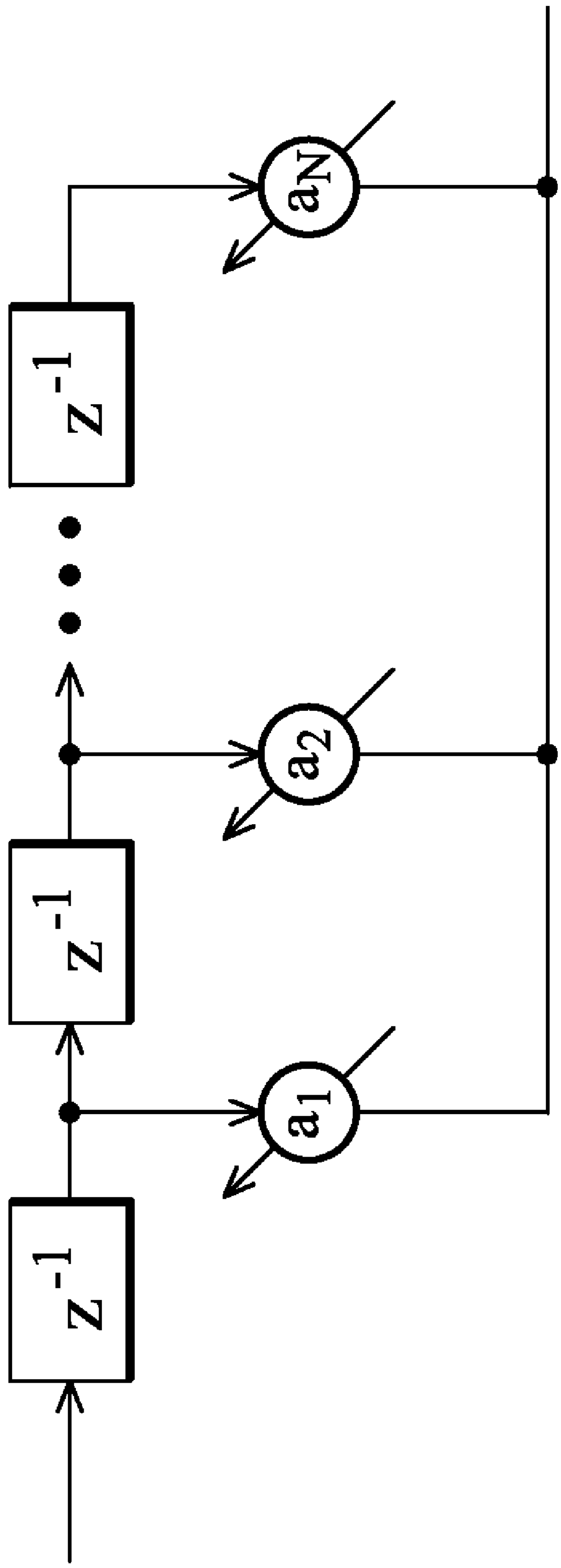
FIG. 2 illustrates a schematic diagram of an adaptive filter.

According to an embodiment of invention, the audio processing apparatus 100 comprises two adaptive filters 104 and 105, instead of one as compared with the conventional design, and a characteristic analyzer 106 and a controller 107 to improve interference filtering performance. The interference filtering performance is improved, especially when the audio processing apparatus 100 is disposed in a noisy environment with low signal to noise ratio (SNR). The adaptive filters 104 and 105 are coupled between the beamformer 102 and the blocking matrix 103 and respectively have a plurality of adaptable filter coefficients. FIG. 2 illustrates a schematic diagram of an adaptive filter, such as the adaptive filter 104 or 105 of FIG. 1. As shown in FIG. 2, the adaptive filter comprises a delay chain and adaptable filter coefficients $a_1, a_2 \ldots a_N$ each corresponding to one delay unit. Referring to FIG. 1, the adaptive filter 104 operates to generate a filtered signal $S_{F1}$ approximating the interference by adaptively filtering the processed signals $S_{BM}$. The filter coefficients of the adaptive filter 104 are continuously adapted according to a subtraction result of the processed signal $S_{BF}$ and the filtered signal $S_{F1}$. It is noted that the adaptive filter 104 operates in the background and the output of the adaptive filter 104 will not be fed into the output of the audio processing apparatus 100. Thus, the adaptive filter 104 is regarded as a shadow filter. The adaptive filter 105 also operates to generate a filtered signal $S_{F2}$ approximating the interference by adaptively filtering the processed signals $S_{BM}$. The filter coefficients of adaptive filter 105 are adapted to generate the optimum output signal $S_{out}$.

According to the embodiment of the invention, the filter coefficients of the adaptive filter (104 and/or 105) may be adapted according to the normalized least mean squares (NLMS) algorithm to minimize the cost for a next adaptation. The NLMS algorithm updates the coefficients of an adaptive filter by using the following equation:

$$\vec{w}(n+1) = \vec{w}(n) + \mu \cdot e(n) \cdot \frac{\vec{u}(n)}{\|\vec{u}(n)\|^2}, \quad \text{Eq. 2}$$

where the error signal e(n)=d(n)−y(n), d(n) is the input signal of the adaptive filter, y(n) is the output signal from the adaptive filter, $\vec{w}(n)$ is the filter coefficients vector, $\vec{u}(n)$ is the filter input vector, and μ is the step size for the coefficient adaptation of the adaptive filter. By way of that, the interference portion is processed through the adaptive filter 105 to minimize the output power of the output signal $S_{out}$, which is equivalent to minimize the interference content of the output signal $S_{out}$.

According to an embodiment of the invention, the step size for the coefficient adaptation of the adaptive filter 105, such as the value μ shown in Eq. 2, may vary with the characteristics of the coefficients of the adaptive filter 104. The characteristic analyzer 106 is coupled to the adaptive filter 104 for analyzing the characteristics of the coefficients of the adaptive filter 104. As an example, the characteristic analyzer 106 monitors the coefficients of the adaptive filter 104 and analyzes energy level of the coefficients. According to the embodiment of the invention, when the source signals are substantially picked up by the microphone array 101A~101M in the desired direction (the direction directed to the position of a speaker), the resulting signals output from the beamformer 102 and the blocking matrix 103 will hypothetically diverge. That is, the difference between the processed signals $S_{BM}$ and $S_{BF}$ will be large. In this case, since the coefficients of the adaptive filter 104 are continuously adapted for minimizing the output energy, the coefficient energy of the adaptive filter 104 would be larger than the coefficient energy in other cases. Thus, according to the embodiment of the invention, the controller 107 coupled between the characteristic analyzer 106 and the adaptive filter 105 generates a control signal $S_{ctrl}$ according to the energy level of the coefficients of the adaptive filter 104, which is analyzed by the characteristic analyzer 106, so as to direct the adaptive filter 105 to change its adaptation step size according to the control signal $S_{ctrl}$.

According to the embodiment of the invention, when the energy level of the coefficients of the adaptive filter 104 increases, the controller 107 may direct the adaptive filter 105 to reduce the adaptation step size. Further, if the energy level exceeds a predetermined threshold, the controller 107 may further direct the adaptive filter 105 to suspend adaptation of the filter coefficients. As previously discussed, although the source signals are substantially picked up in the desired direction, the blocking matrix 130 may not be able to completely remove the source signal from the input signals, and some source signals may still remain in the processed signal $S_{BM}$. As a result, the output signal $S_{out}$, which is supposed to be a clean version of the desired source signal, would be distorted by subtracting the filtered signal $S_{F2}$ from the processed signal $S_{BF}$. Thus, in this case, the adaptation step size of the adaptive filter 105 is preferably reduced, or even set to zero so as to slow down or suspend the adaptation. On the other hand, when the energy level of the coefficients of the adaptive filter 104 decreases, the controller 107 may direct the adaptive filter 105 to increase or maintain the adaptation step size, or to resume adaptation (if it was suspended).

Figure 3:
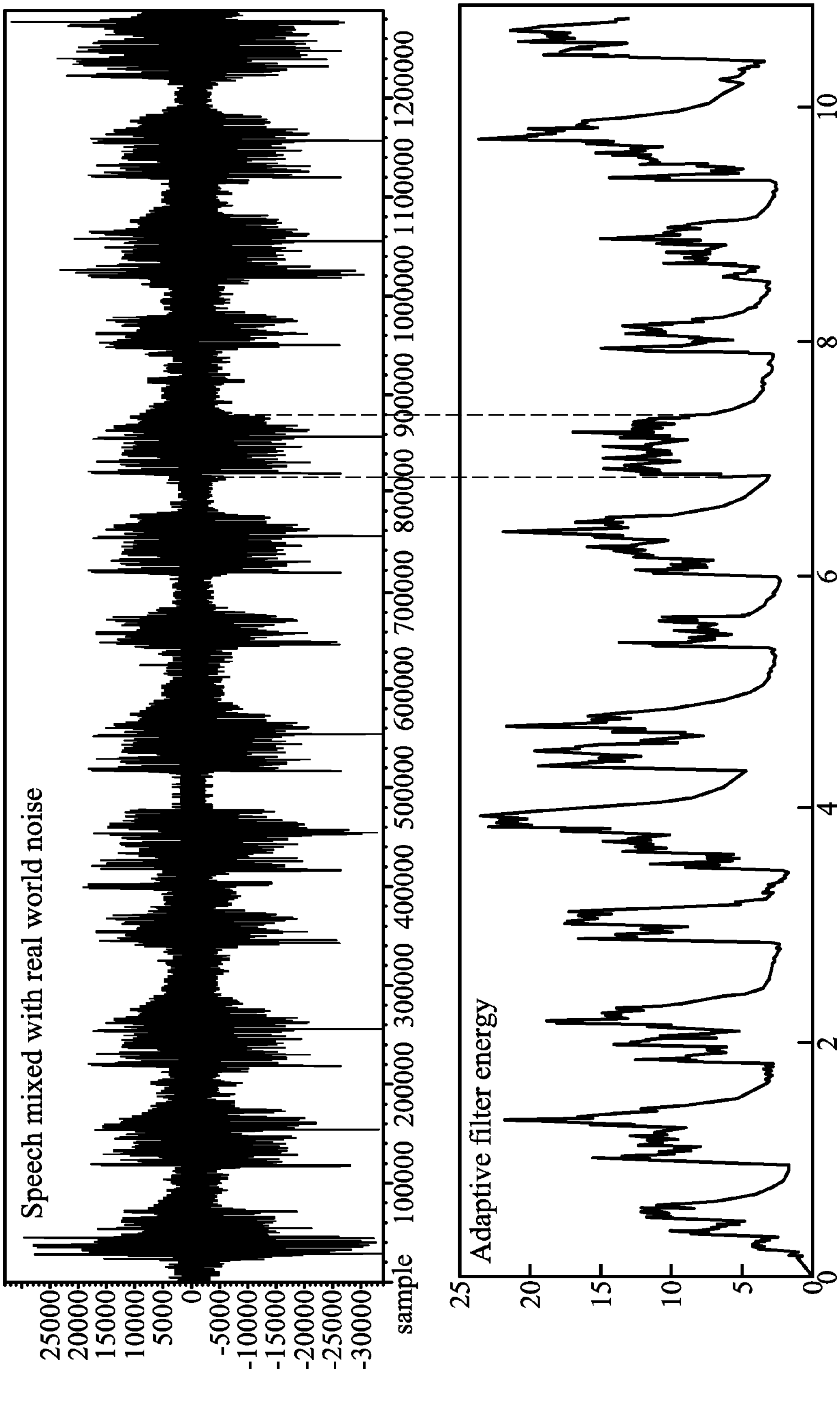
FIG. 3 shows the exemplary waveforms of a speech signal mixed real world noise and energy of the adaptive filter.

FIG. 3 shows exemplary waveforms of a speech signal mixed real world noise (in the upper part) and energy level of the filter coefficients of the adaptive filter 104 (in the lower part). As FIG. 3 shows, as the presence level of the speech increases, the energy level increases. With reference of this relationship, the desired signals are easily distinguished from the mixed interference. Thus, according to the embodiment of the invention, by analyzing the energy level of the coefficients of the adaptive filter 104, the properties of the input signals are obtained, and then, the interference filtering performance of the audio processing apparatus 100 is greatly improved by varying the adaptation step size.

Figure 4:
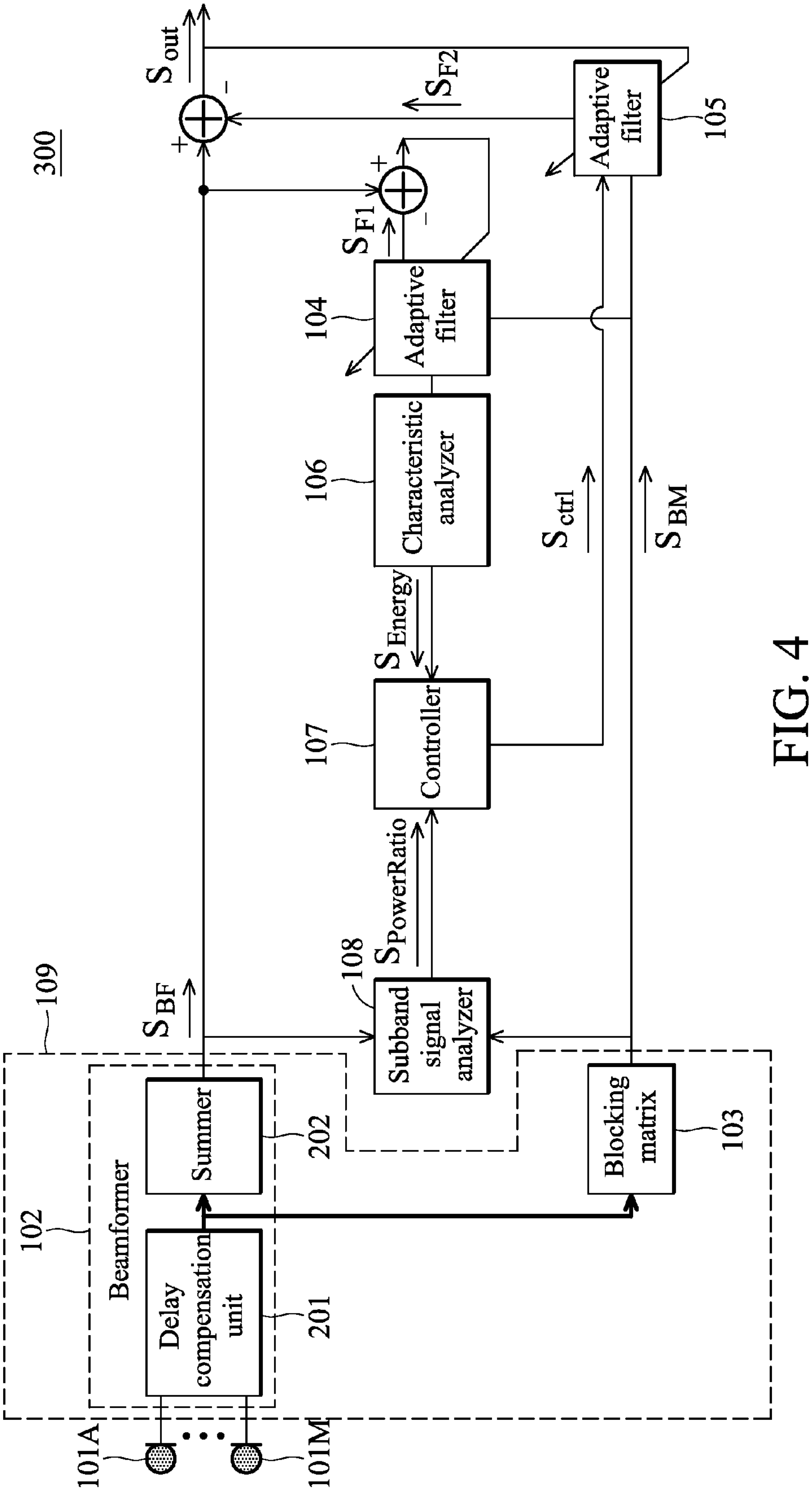
FIG. 4 illustrates another audio processing apparatus in a system according to the first embodiment of the invention.

FIG. 4 illustrates another audio processing apparatus 300 in a system according to the first embodiment of the invention. Comparing with the audio processing apparatus 100 shown in FIG. 1, the audio processing apparatus 300 further comprises a subband signal analyzer 108 coupled between the beamformer 102, the blocking matrix 103 and the controller 107. It is noted that the operations of the beamformer 102, the blocking matrix 103, adaptive filters 104 and 105, and the characteristic analyzer 106 are similar with those shown in FIG. 1 and are not described here for brevity. According to the embodiment of the invention, the subband signal analyzer 108 receives the processed signals $S_{BF}$ and $S_{BM}$, and respectively filters the processed signals $S_{BF}$ and $S_{BM}$. The subband signal analyzer 108 filters out the signals outside of the band 250~750 HZ corresponding to human voice activity to obtain a subband signal for each processed signal. According to the embodiment of the invention, the subband signal analyzer 108 further obtains a power ratio according to a signal power of the subband signals. The power ratio may be obtained by dividing the signal power of the subband signal of the processed signal $S_{BM}$ by the signal power of the subband signal of the processed signal $S_{BF}$. As an example, for a microphone array with M=2, suppose that signal $S_A$ represents the signal picked by the first microphone and signal $S_B$ represents the signal picked by the second microphone, wherein the signals $S_A$ and $S_B$ are both delay compensated, the processed signals $S_{BF}$ and $S_{BM}$ could be respectively obtained by $(S_A+S_B)$ and $(S_A-S_B)$. Thus, in this case, the power ratio is obtained according to the following equation:

$$PR = \frac{P_A - P_B}{P_A + P_B}, \quad \text{Eq. 3}$$

where $P_A+P_B$ represents the power of the subband signal of the processed signals $S_{BF}$, and $P_A-P_B$ represents the power of the subband signal of the processed signals $S_{BM}$.

As previously described, when the source signals are substantially picked up by the microphone array 101A~101M in the desired direction, the resulting signals output from the beamformer 102 and the blocking matrix 103 will hypothetically diverge. That is, the difference between the processed signals $S_{BM}$ and $S_{BF}$ will be large. Thus, it can be seen from Eq. 3 that the obtained power ratio will be small. According to an embodiment of the invention, in addition to reference with the energy level of the adaptive filter 104, the controller 107 may generate the control signal $S_{ctrl}$ according to the power ratio obtained by the subband signal analyzer 108 to improve further interference filter performance. As an example, when the energy level increases or the power ratio decreases, the controller 107 accordingly directs the adaptive filter 105 to reduce the adaptation step size. Further, when the energy level exceeds a first predetermined threshold or the power ratio does not exceed a second predetermined threshold, the controller 107 accordingly directs the adaptive filter 105 to suspend adaptation. On the other hand, when the energy level decreases or the power ratio increases, the controller 107 accordingly directs the adaptive filter 105 to maintain or increase the adaptation step size, or to resume the adaptation (if it was suspended).

Figure 5A:
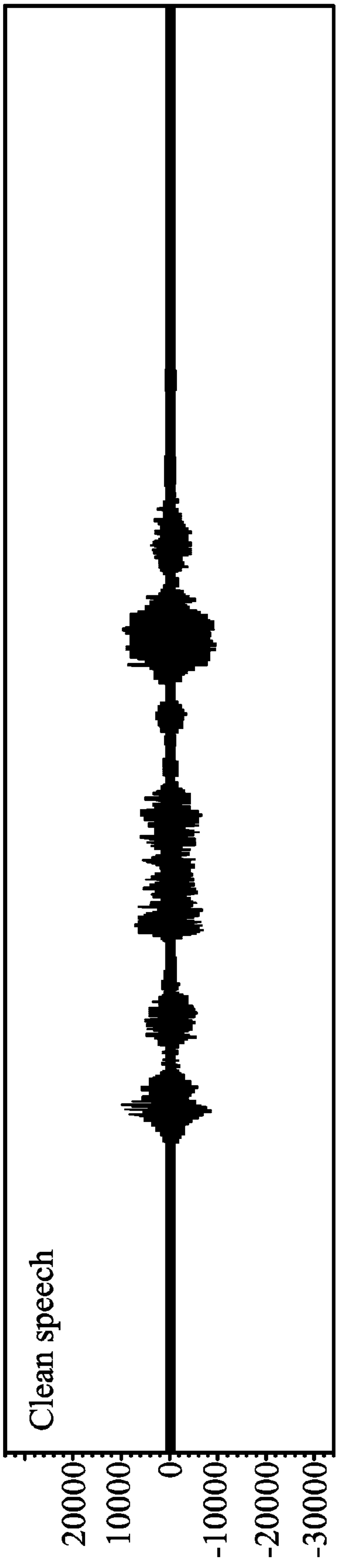
FIG. 5*a* shows an exemplary waveform of a speech signal.
Figure 5B:
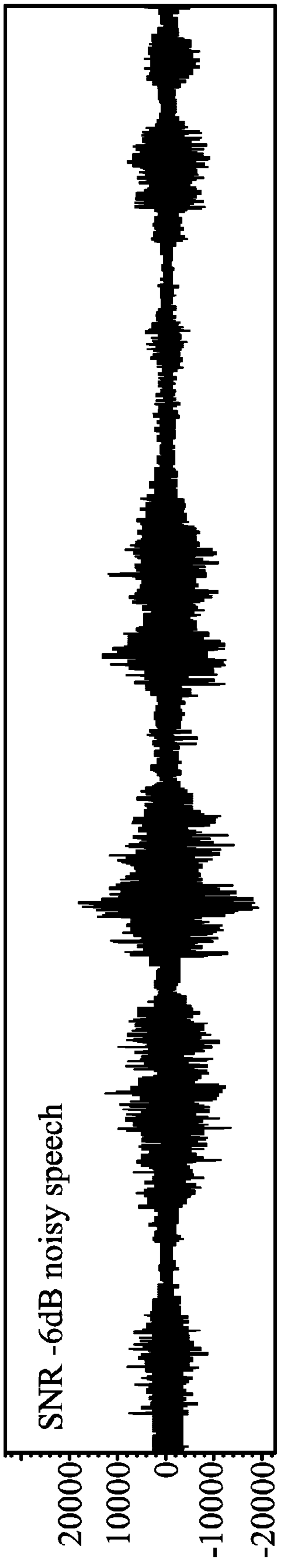
FIG. 5*b* shows an exemplary waveform of another speech signal with SNR=−6 dB.
Figure 5C:
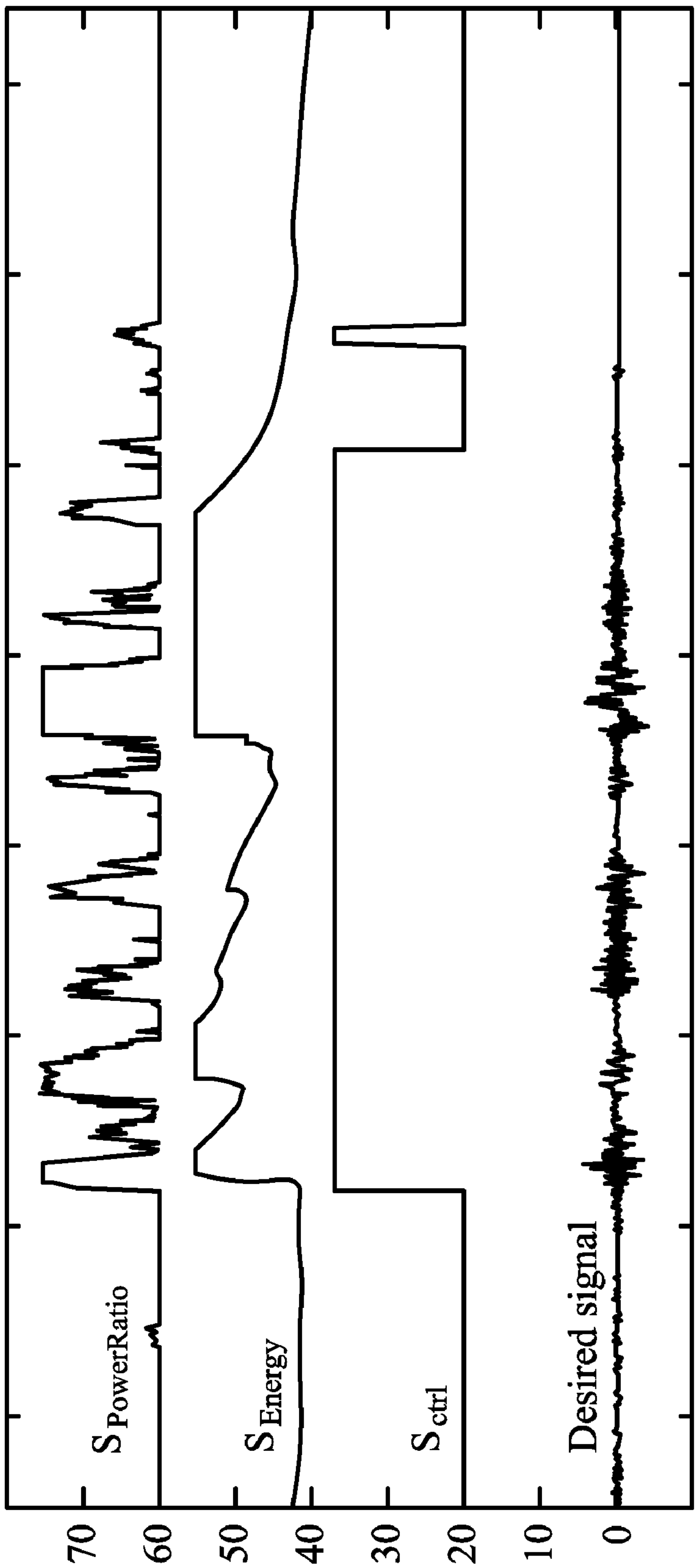
FIG. 5*c* shows the exemplary waveforms of the analysis results of obtained energy levels, power ratios, the control signals.

FIG. 5*a*~5*c* shows some experiment results according to the embodiment of the invention. In FIG. 5*a*, an exemplary waveform of a speech signal is shown. In FIG. 5*b*, an exemplary waveform of another noisy speech signal with SNR=−6 dB is shown. In the experiment, simulation of a speech mixed with speech case is conducted. Note that the speech signal shown in FIG. 5*a* is the desired source signal. FIG. 5*c* shows the exemplary waveforms of the energy level signal $S_{Energy}$ output by the characteristic analyzer 106 according to the coefficients energy of the adaptive filter 104, the power ratio signal $S_{PowerRatio}$ output by the subband signal analyzer 108 according to the power ratio of processed signals, and the control signal $S_{ctrl}$ output by the controller 107 according to the energy level signal $S_{Energy}$ and the power ratio signal $S_{PowerRatio}$. It is noted that the signal level of the power ratio signal $S_{PowerRatio}$ as shown in FIG. 5*c*, is properly inversed so as to consist with the adaptive filter energy. That is, when the power ratio PR obtained according to Eq. 3 decreases, the amplitude of the resulting signal $S_{PowerRatio}$ increases. Thus, as the energy level of the signal in the desired direction increases, the power ratio decreases, implies the amplitude of the signal $S_{PowerRatio}$ increases. By way of that, when the desired signal is present, the amplitude of the energy level signal $S_{Energy}$, and the amplitude of the power ratio signal $S_{PowerRatio}$ rise. The controller 107 may make a decision to suspend or resume the adaptation of the adaptive filter 105 in accordance with both the energy level signal $S_{Energy}$, and the power ratio signal $S_{PowerRatio}$. As an example, the controller 107 may obtain a decision value according to the following equations:

$$\text{decision\_value} = \text{Function1}(S_{Energy}) + \text{Function2}(S_{PowerRatio}) \quad \text{Eq. 4}$$

and $$S_{ctrl} = \begin{cases} 1, & \text{when decision\_value} > TH \\ 0, & \text{otherwise} \end{cases} \quad \text{Eq. 5}$$

The functions Function1( ) and Function2( ) may be designed flexibly according to different scenarios and thus, the controller 107 may obtain the decision value with adjustable weighting for the energy level signal $S_{Energy}$ and the power ratio signal $S_{powerRatio}$. In the embodiment of the invention, when $S_{ctrl}=1$, which means the desired signal is present, the adaptive filter 105 suspends the adaptation of its filter coefficients. On the other hand, when $S_{ctrl}=0$, the adaptive filter 105 may resume adaptation. As can be seen from FIG. 5*c*, by considering both of the filter energy and power ratio, desired signals may be clearly distinguished from the mixed interference. Thus, the interference filtering performance of the audio processing apparatus 300 is greatly improved by controlling the adaptation step size accordingly.

Figure 6:
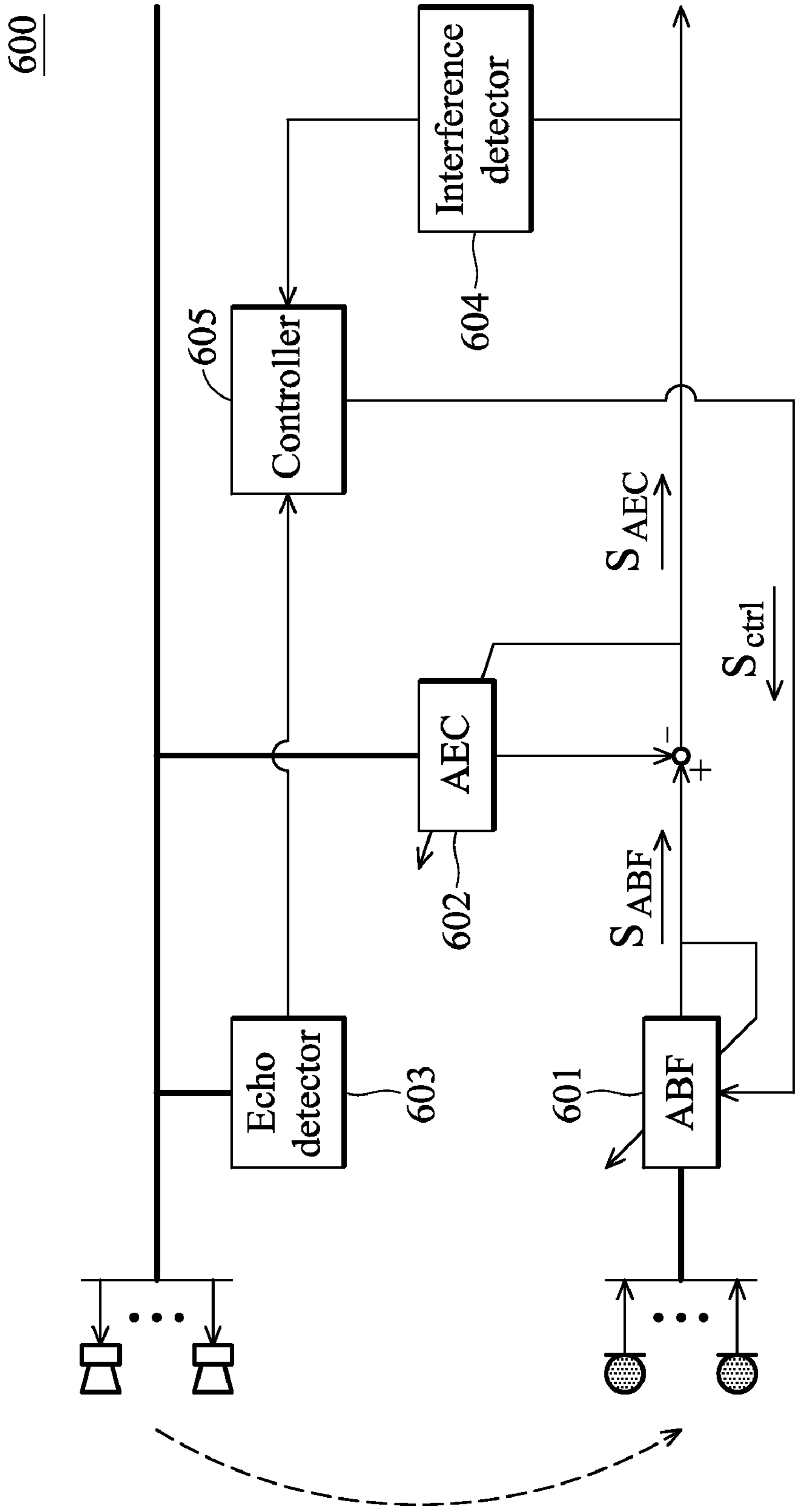
FIG. 6 illustrates an audio processing apparatus in a system according to a second embodiment of the invention.

FIG. 6 illustrates an audio processing apparatus 600 in a system according to a second embodiment of the invention. According to the embodiment of the invention, the system may be a mobile phone or a Bluetooth handset, and as shown in FIG. 6, the system may comprises one or more loudspeakers and a linear array of microphones, mounted inside (or disposed outside) of the audio processing apparatus 600, to respectively play and pick up the audio signals. Generally, the audio signals picked up from noisy channels comprise at least one of a source signal, interference and echo, where the source signal is the desired signal, such as voice of a human, the interference refer to all environment or background noise, and the echo, in this case, refers to acoustic echo such as an originator being able to hear his/her own speech after a certain delay. According to the embodiment of the invention, the audio processing apparatus 600 comprises an adaptive beamforming filter (ABF) 601, an adaptive echo canceller (AEC) 602 disposed after the ABF 601, an echo detector 603, an interference detector 604 and a controller 605. The ABF 601 receives a plurality of input signals in a first acoustic path (the lower path shown in FIG. 6) from the microphone array of the system. The ABF 601 operates to cancel the interference from the input signals to generate a processed signal $S_{ABF}$ and adaptively change adaptation step size of a plurality of filter coefficients according to a control signal $S_{ctrl}$. According to the embodiment of the invention, details of the ABF 601 may refer to FIG. 1 or FIG. 4. The AEC 602 is coupled to the first acoustic path and at least one loudspeaker in a second acoustic path (the upper path shown in FIG. 6) of the system and operates to cancel the echo from the processed signal $S_{ABF}$ to generate a processed signal $S_{AEC}$.

According to an embodiment of the invention, the rate of filter adaptation (i.e. the step size μ shown in Eq. 2) of the ABF 601 is controlled by the control signal $S_{ctrl}$ generated according to the extent of interference remaining in the processed signal $S_{AEC}$ and presence of the echo in the input signals. As shown in FIG. 6, the echo detector 603 is coupled to the loudspeaker to detect the presence of echo according to signal energy in the second acoustic path. As an example, when any signal is to be played by the loudspeaker, echo could be picked up by the microphones and could be present in the input signal with certain delay. Thus, the echo detector 603 may monitor the signal energy in the second acoustic path to determine whether the echo is present. The interference detector 604 further detects the extent of interference remaining in the processed signal $S_{AEC}$ according to a correlation between the two signals in the first acoustic path. As an example, the interference detector 604 may calculate the correlation between the processed signals $S_{AEC}$ and $S_{ABF}$, or the correlation between the processed signals $S_{AEC}$ and $S_{BF}$ (as shown in FIG. 1 or FIG. 4). Hypothetically, a larger correlation means more interference remains. Thus, the step size of filter adaptation of the ABF 601 is increased. On the contrary, the ABF 601 reduces the adaptation step size when the correlation decreases. According to an embodiment of the invention, the controller 605 is coupled between the echo detector 603, the interference detector 604 and the ABF 601, and generates the control signal $S_{ctrl}$ according to detection results of the echo detector 603 and the interference detector 604.

Table 1 shows the decision rule for controlling the adaptation step size of the filter coefficients of the ABF 601.

TABLE 1 decision rule for controlling the adaptation step size of ABF 601

| | Echo is present | Echo is not present |
|---|---|---|
| Interference is cancelled | ABF suspends adaptation | ABF normally adapts |
| Interference remains | ABF slowly adapts | ABF normally adapts |

As shown in Table 1, when the echo detector 603 detects that the echo is present and the interference detector 604 detects that interference remains in the processed signal $S_{AEC}$, the controller 605 generates the control signal $S_{ctrl}$ accordingly so as to direct the ABF 601 to reduce the adaptation step size. When the echo detector 603 detects that the echo is present and the interference detector 604 detects that interference is cancelled, the controller 605 generates the control signal $S_{ctrl}$ accordingly so as to direct the ABF 601 to suspend the adaptation. And when the echo detector 603 detects that the echo is not present, the controller 605 generates the control signal $S_{ctrl}$ accordingly so as to direct the ABF 601 to maintain or increase the adaptation step size. As an example, when the ABF 601 is directed to suspend adaptation, the step size μ may be controlled by setting:

$$\mu=\mu\cdot 0 \quad \text{Eq. 6}$$

When the ABF 601 is directed to reduce the adaptation step size, the step size μ may be controlled by setting:

$$\mu=\mu\cdot\frac{1}{64} \quad \text{Eq. 7}$$

When the ABF 601 is directed to increase the adaptation step size, the step size μ may be controlled by setting:

$$\mu=\mu\cdot\frac{65}{64} \quad \text{Eq. 8}$$

It is noted that in the conventional design, the AEC is usually disposed in front of the ABF for achieving better filtering performance. However, a drawback of such implementation is that the number of AEC filters should be equal to the number of microphones so as to perform echo cancellation for each individual noisy channel. Thus, the computation cost increases as the number of microphones increases. According to the embodiment of the invention, the ABF 601 is designed to be disposed in front of the AEC 602. Thus, only one AEC is required in the audio processing apparatus 600. Further, the adaptation step size of the ABF 601 is adequately controlled as shown in Table 1 in accordance with the extent of the interference remaining in the processed signal $S_{AEC}$ and presence of the echo in the input signals. In this way, compared with the conventional design, the proposed structure not only greatly reduces the computation cost, but also improves the filtering performance by adequately controlling the adaptation step size of the ABF.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An audio processing apparatus in a system, comprising:

a signal generator outputting a first processed signal and a second processed signal, wherein the signal generator comprising:

a beamformer receiving a plurality of input signals from a microphone array and processing the input signals to generate the first processed signal, wherein the input signals comprise at least one of a source signal and interference;

a blocking matrix receiving the input signals and operating to cancel the source signal from the input signals to generate the second processed signal;

a characteristic analyzer coupled to a first adaptive filter for analyzing characteristics of a plurality of first filter coefficients; and a controller coupled between the characteristic analyzer and a second adaptive filter and generating a control signal according to the characteristics of the first filter coefficients;

the first adaptive filter coupled to the signal generator and having the first filter coefficients that are adaptable, wherein the first adaptive filter generates a first filtered signal according to the first and second processed signals and adapts the first filter coefficients according to the first filtered signal and the first processed signal; and the second adaptive filter coupled to the signal generator and having a plurality of second filter coefficients that are adaptable, wherein the second adaptive filter generates a second filtered signal approximating the interference according to the first and second processed signals and selectively adapts the second filter coefficients according to the first filter coefficients and an output signal generated according to the second filtered signal and the first processed signal, and wherein the second adaptive filter changes an adaptation step size of the second filter coefficients according to the control signal.

2. The audio processing apparatus as claimed in claim 1, wherein the characteristic analyzer monitors the first filter coefficients and analyzes energy level of the first filter coefficients.

3. The audio processing apparatus as claimed in claim 2, wherein when the energy level increases, the controller generates the control signal accordingly so as to direct the second adaptive filter to reduce the adaptation step size.

4. The audio processing apparatus as claimed in claim 2, wherein when the energy level exceeds a first predetermined threshold, the controller generates the control signal accordingly so as to direct the second adaptive filter to suspend the adaptation of the second filter coefficients.

5. The audio processing apparatus as claimed in claim 1, further comprising:

a subband signal analyzer coupled between the beamformer, the blocking matrix and the controller, receiving the first and second processed signals, respectively filtering the first and second processed signals to obtain a first subband signal and a second subband signal, and obtaining a power ratio according to signal power of the first and second subband signals, wherein the controller generates the control signal according to the power ratio and the characteristics of the first filter coefficients.

6. The audio processing apparatus as claimed in claim 5, wherein the characteristic analyzer monitors the first filter coefficients and analyzes energy level of the first filter coefficients, and the subband signal analyzer obtains the power ratio according to a ratio of the signal power of the second subband signal to the signal power of the first subband signal, and wherein when the energy level increases or when the power ratio decreases, the controller generates the control signal accordingly so as to direct the second adaptive filter to reduce the adaptation step size.

7. The audio processing apparatus as claimed in claim 6, wherein when the energy level exceeds a first predetermined threshold or the power ratio does not exceed a second predetermined threshold, the controller generates the control signal accordingly so as to direct the second adaptive filter to suspend the adaptation of the second filter coefficients.

8. The audio processing apparatus as claimed in claim 1, wherein the system is a mobile phone or a Bluetooth handset.

9. The audio processing apparatus as claimed in claim 1, wherein the output signal is generated by subtracting the second filtered signal from the first processed signal.

10. An audio processing apparatus in a system, comprising:

an adaptive beamforming filter receiving a plurality of input signals in a first acoustic path from a microphone array of the system, wherein the input signals comprise at least one of a source signal, interference and echo, and wherein the adaptive beamforming filter operates to cancel the interference from the input signals to generate a first processed signal and selectively change an adaptation step size of a plurality of filter coefficients according to a control signal, wherein the control signal is generated according to the presence of the echo in the input signals; and an adaptive echo canceller coupled between the first acoustic path and at least one loudspeaker in a second acoustic path of the system and operating to cancel the echo from the first processed signal to generate a second processed signal.

11. The audio processing apparatus as claimed in claim 10, wherein the control signal is generated in accordance with the extent of the interference remaining in the second processed signal and presence of the echo in the input signals.

12. The audio processing apparatus as claimed in claim 10, further comprising:

an echo detector coupled to the loudspeaker and detecting the presence of the echo according to signal energy in the second acoustic path;

an interference detector detecting the extent of interference remaining in the second processed signal according to a correlation between two signals in the first acoustic path; and a controller coupled between the echo detector, the interference detector and the adaptive beamforming filter, generating the control signal according to detection results of the echo detector and the interference detector.

13. The audio processing apparatus as claimed in claim 12, wherein when the correlation decreases, the controller generates the control signal accordingly so as to direct the adaptive beamforming filter to reduce the adaptation step size.

14. The audio processing apparatus as claimed in claim 12, wherein when the echo detector detects that the echo is present, the controller generates the control signal accordingly so as to direct the adaptive beamforming filter to reduce the adaptation step size.

15. The audio processing apparatus as claimed in claim 12, wherein when the echo detector detects that the echo is present, the controller generates the control signal accordingly so as to direct the adaptive beamforming filter to suspend the adaptation.

16. The audio processing apparatus as claimed in claim 12, wherein when the echo detector detects that the echo is present and the interference detector detects that interference remains in the second processed signal, the controller generates the control signal accordingly so as to direct the adaptive beamforming filter to reduce the adaptation step size.

17. The audio processing apparatus as claimed in claim 12, wherein when the echo detector detects that the echo is present and the interference detector detects that no interference remains in the second processed signal, the controller generates the control signal accordingly so as to direct the adaptive beamforming filter to suspend the adaptation.

18. The audio processing apparatus as claimed in claim 12, wherein when the echo detector detects that the echo is not present, the controller generates the control signal accordingly so as to direct the adaptive beamforming filter to maintain or increase the adaptation step size.

19. The audio processing apparatus as claimed in claim 10, wherein the system is a mobile phone or a Bluetooth handset.

* * * * *